United States Patent
Chen et al.

(10) Patent No.: US 10,172,458 B2
(45) Date of Patent: Jan. 8, 2019

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/584,045

(22) Filed: May 2, 2017

(65) Prior Publication Data
US 2018/0116398 A1 May 3, 2018

(30) Foreign Application Priority Data

Nov. 1, 2016 (TW) .............................. 105135627 A

(51) Int. Cl.
| | |
|---|---|
| H05K 7/14 | (2006.01) |
| A47B 88/43 | (2017.01) |
| A47B 96/07 | (2006.01) |
| A47B 88/44 | (2017.01) |
| A47B 96/06 | (2006.01) |

(52) U.S. Cl.
CPC ........... *A47B 88/43* (2017.01); *H05K 7/1489* (2013.01); *A47B 88/44* (2017.01); *A47B 96/068* (2013.01); *A47B 96/07* (2013.01); *H05K 7/1421* (2013.01)

(58) Field of Classification Search
CPC ....... A47B 88/43; A47B 96/07; A47B 96/067; A47B 96/061; A47B 88/44; A47B 96/068; H05K 7/1489; H05K 7/1421; H05K 7/183
USPC ... 248/27.1, 220.21, 221.11, 225.11, 222.11, 248/250; 312/334.7, 334.8, 334.46, 312/334.44; 211/26, 86.01, 123
See application file for complete search history.

(56) References Cited

U.S. PATENT DOCUMENTS

| | | | |
|---|---|---|---|
| 9,066,591 B2* | 6/2015 | Chen | A47B 88/044 |
| 9,125,489 B2* | 9/2015 | Chen | A47B 88/044 |
| 9,629,460 B1 | 4/2017 | Chen | |
| 9,986,828 B2* | 6/2018 | Chen | A47B 88/407 |
| 2005/0156493 A1* | 7/2005 | Yang | H05K 7/1489 312/334.5 |

(Continued)

FOREIGN PATENT DOCUMENTS

CN 103945671 1/2017

*Primary Examiner* — Tan Le
(74) *Attorney, Agent, or Firm* — Winston Hsu

(57) ABSTRACT

A bracket device includes a bracket, a fastening member and a supporting frame. The bracket includes a side wall and at least one mounting member adjacent to the side wall. The fastening member is movably mounted to the bracket and includes a supporting leg. The supporting frame is movably mounted to the bracket and includes a supporting structure. When the supporting frame is moved relative to the bracket from one position to another position, the supporting structure of the supporting frame is configured to drive the fastening member to switch from a first state to a second state relative to the at least one mounting member through the supporting leg.

18 Claims, 11 Drawing Sheets

(56) References Cited

U.S. PATENT DOCUMENTS

2013/0056432 A1\* 3/2013 Lin ...................... H05K 7/1489
　　　　　　　　　　　　　　　　　　　　　　　　 211/123
2016/0097229 A1\* 4/2016 Chen ...................... A47B 88/40
　　　　　　　　　　　　　　　　　　　　　　　　　16/94 R \* cited by examiner

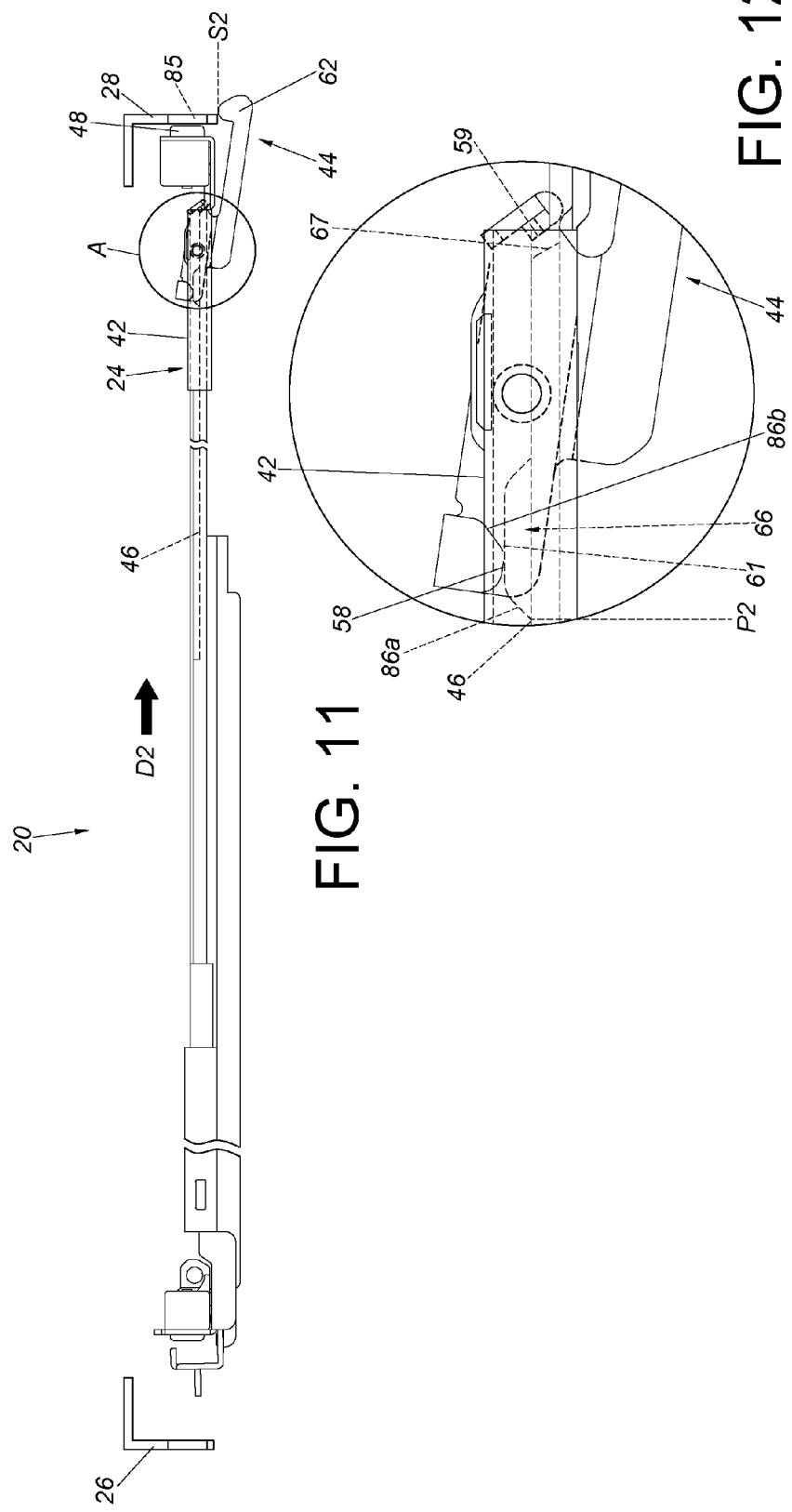

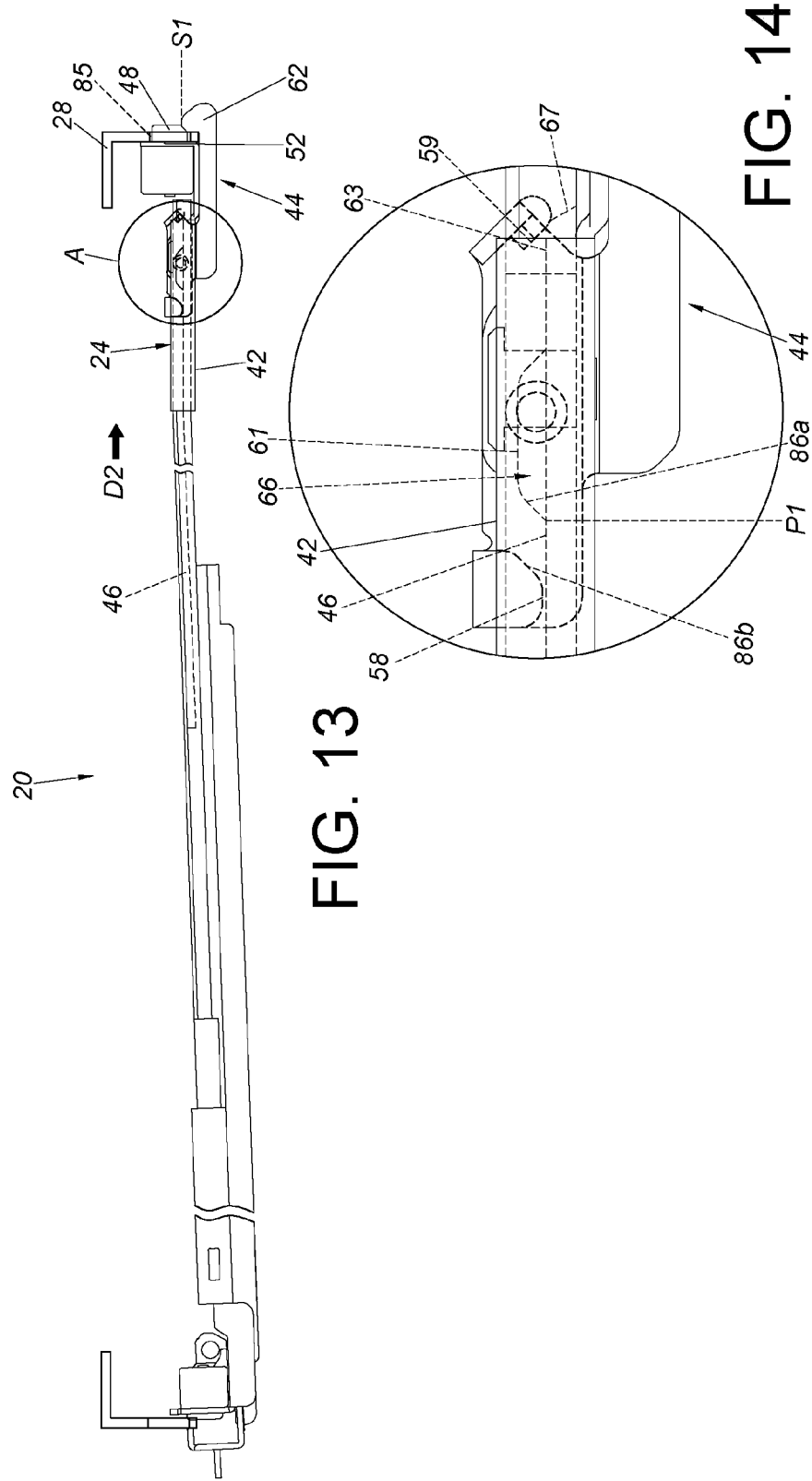

BRACKET DEVICE

BACKGROUND OF THE INVENTION

1. Field of the Invention

The present invention relates to a bracket device, and more particularly, to a bracket device capable of mounting a slide rail assembly to a post of a rack.

2. Description of the Prior Art

China patent publication number CN 102695396B discloses a tool-free slide rail mounting frame for server. The tool-free slide rail mounting frame for server comprises a pair of rack positioning columns (4) arranged on a slide rail rear mounting frame (1) and a rack floating hook (2). The rack floating hook (2) comprises a pair of hooks (203) respectively arranged on a pair of wings (205). The wings (205) are respectively provided with slide guiding sleeves (201) and are in fixed connection through an arch-shaped bending member (206). The slide rail rear mounting frame (1) is fixed with two slide guiding columns (101). The slide guiding columns (101) are sleeved in the slide guiding sleeves (201) and are in fixed connection through limit screws (7). First return springs are arranged on the slide guiding sleeves (201) and between the wings (205) and the limit screws (7). The slide rail rear mounting frame (1) is further provided with a floating pin hole for placing a floating pin (3). One end of the floating pin (3) is connected to the arch-shaped bending member (206) through the limit screws (7), and the other end of the floating pin is a conical head (301) arranged in the floating pin hole (104). Second return springs are arranged on the floating pin (3) and between an end face of the conical head (301) and the limit screws (7).

According to the above arrangement, the tool-free slide rail mounting frame for server can be driven by an outer rail covered by a rear frame through the floating pin (3), so as to lock/release the slide rail rear mounting frame (1). However, the design disclosed in the prior art is limited to a length of the outer rail and adjustable degree of a bracket cooperated with the outer rail, such that usage of the tool-free slide rail mounting frame for server is limited accordingly. In other words, the outer rail is required to be long enough to lock/release the rear slide rail mounting frame (1).

SUMMARY OF THE INVENTION

The present invention relates to a bracket device, and more particularly, to a bracket device capable of operating a fastening member easily.

According to an embodiment of the present invention, a bracket device comprises a bracket, a fastening member, and a supporting frame. The bracket comprises at least one mounting member. The fastening member is movably mounted to the bracket. The fastening member comprises a supporting leg. The supporting frame is movable relative to the bracket. The supporting frame comprises a supporting structure. Wherein, when the supporting frame is located at a position relative to the bracket, the supporting structure of the supporting frame does not abut against the supporting leg of the fastening member, so as to allow the fastening member to be in a first state relative to the at least one mounting member. Wherein, when the supporting frame is moved away from the position relative to the bracket, the supporting structure of the supporting frame is configured to abut against the supporting leg of the fastening member, so as to allow the fastening member to be in a second state relative to the at least one mounting member.

Preferably, the bracket device further comprises an elastic member attached to the supporting frame. The elastic member has an engaging feature. The bracket further comprises a first feature and a second feature located at different positions. The engaging feature is configured to engage with one of the first feature and the second feature.

Preferably, the engaging feature is a protrusion, and the first feature and the second feature are positioning holes.

Preferably, when the supporting frame is located at the position relative to the bracket, the engaging feature of the elastic member is engaged with the first feature of the bracket.

Preferably, one of the supporting frame and the bracket comprises a limiting structure. The supporting frame is movable relative to the bracket within a limited range defined by the limiting structure.

Preferably, the bracket comprises a side wall and an end wall substantially particularly connected to the side wall. The at least one mounting member is mounted to the end wall.

Preferably, the side wall of the bracket has a first bending part and a second bending part. A space is defined between the first bending part and the second bending part. The supporting frame is movable in the space.

Preferably, the fastening member is pivoted to the bracket.

Preferably, the supporting frame further comprises an extension part and a guiding structure. The extension part is located between the supporting structure and the guiding structure. The supporting structure comprises a supporting section and a guiding section adjacent to the supporting section. The fastening member further comprises a guiding leg. When the supporting frame is located at the position relative to the bracket, the extension part of the supporting frame abuts against the guiding leg of the fastening member so as to hold the fastening member in the first state. When the supporting frame is moved away from the position relative to the bracket, the guiding section of the supporting structure is configured to move the supporting leg of the fastening member so as to drive the fastening member to switch from the first state to the second state. When the fastening member is in the second state, the supporting section of the supporting structure is configured to abut against the supporting leg of the fastening member. When the supporting frame returns to the position relative to the bracket, the guiding structure of the supporting frame is configured to drive the fastening member to switch from the second state to the first state through the guiding leg.

According to another embodiment of the present invention, a bracket device comprises a bracket, a fastening member, and a supporting frame. The bracket comprises a side wall, and at least one mounting member mounted adjacent to an end of the side wall. The fastening member is movably mounted to the bracket. The fastening member comprises a supporting leg. The supporting frame is movably mounted to the bracket. The supporting frame comprises a supporting structure. Wherein, when the supporting frame is located at a position relative to the bracket, the fastening member is in a locking state relative to the at least one mounting member. Wherein, when the supporting frame is moved away from the position relative to the bracket, the supporting structure of the supporting frame is configured to drive the fastening member to be no longer in the locking state relative to the at least one mounting member through the supporting leg.

Preferably, the bracket device further comprises an elastic member attached to the supporting frame. The elastic member has an engaging feature. The bracket further comprises a first feature and a second feature located at different positions. The engaging feature is engaged with one of the first feature and the second feature.

Preferably, the engaging feature is a protrusion, and the first feature and the second feature are positioning holes.

Preferably, when the supporting frame is located at the position relative to the bracket, the engaging feature of the elastic member is engaged with the first feature of the bracket; when the supporting frame is moved away from the bracket, the engaging feature of the elastic member is engaged with the second feature of the bracket.

Preferably, one of the supporting frame and the bracket comprises a limiting structure. The supporting frame is movable relative to the bracket within a limited range defined by the limiting structure.

Preferably, the limiting structure is a bounded elongated hole, and the bracket device further comprises a connecting member passing through a portion of the limiting structure for connecting the supporting frame to the bracket.

Preferably, the side wall of the bracket has a first bending part and a second bending part. A space is defined between the first bending part and the second bending part. The supporting frame is movable in the space.

Preferably, the fastening member is pivoted to the bracket. The supporting frame further comprises an extension part and a guiding structure. The extension part is located between the supporting structure and the guiding structure. The supporting structure comprises a supporting section and a guiding section adjacent to the supporting section. The fastening member further comprises a guiding leg. When the supporting frame is located at the position relative to the bracket, the extension part of the supporting frame abuts against the guiding leg of the fastening member so as to hold the fastening member in the locking state. When the supporting frame is moved away from the position relative to the bracket, the guiding section of the supporting structure is configured to move the supporting leg of the fastening member so as to drive the fastening member to be no longer in the locking state. When the fastening member is not in the locking state, the supporting section of the supporting structure is configured to abut against the supporting leg of the fastening member. When the supporting frame returns to the position relative to the bracket, the guiding structure of the supporting frame is configured to drive the fastening member to return to the locking state through the guiding leg.

According to another embodiment of the present invention, a bracket device is configured to be mounted to a post. The post has at least one hole. The bracket device comprises a bracket, a fastening member, and a supporting frame. The bracket comprises at least one mounting member. The fastening member is movably mounted to the bracket. The supporting frame is movable relative to the bracket to be located at one of a first position and a second position. Wherein, when the supporting frame is located at the second position relative to the bracket, the supporting frame is configured to hold the fastening member to be in an unlocking state relative to the at least one mounting member of the bracket. Wherein, when the at least one mounting member of the bracket enters the at least one hole of the post along a direction with the bracket abutting against the post to allow the supporting frame to move relative to the bracket along the direction from the second position to the first position, the supporting frame drives the fastening member to switch from the unlocking state to a locking state for locking the post.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 11 is a diagram showing the slide rail assembly being mounted toward the second post through the bracket device according to an embodiment of the present invention.

FIG. 12 is an enlarged view of an area A of FIG. 11.

FIG. 13 is a diagram showing the bracket device of the slide rail assembly being mounted to the second post according to an embodiment of the present invention.

FIG. 14 is an enlarged view of an area A of FIG. 13.

DETAILED DESCRIPTION

Figure 1:
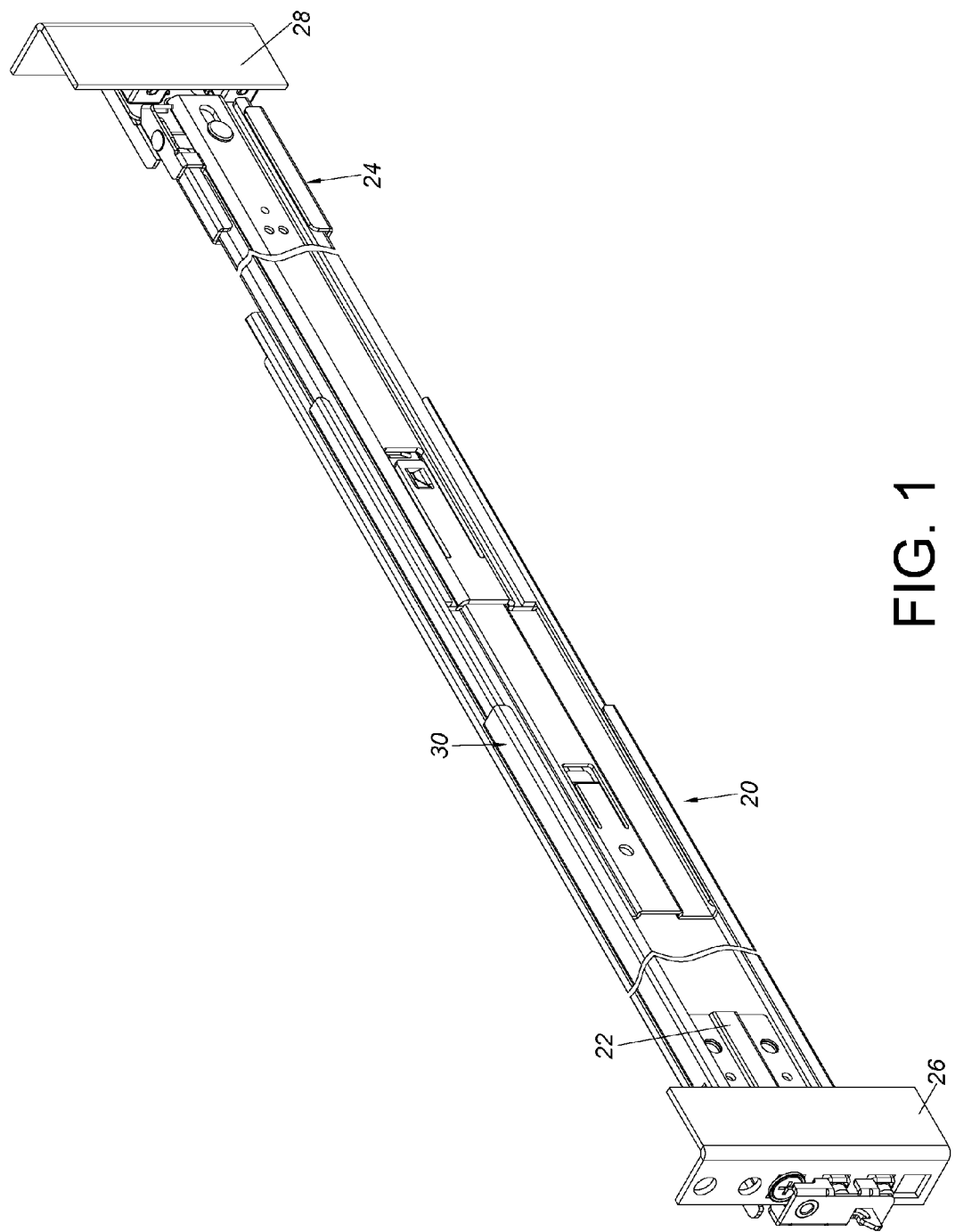
FIG. 1 is a diagram showing a slide rail assembly being mounted to a first post and a second post according to an embodiment of the present invention.

As shown in FIG. 1, a slide rail assembly 20 of an embodiment of the present invention is configured to be mounted to a first post 26 and a second post 28 of a rack through a first bracket 22 and a bracket device 24.

Figure 2:
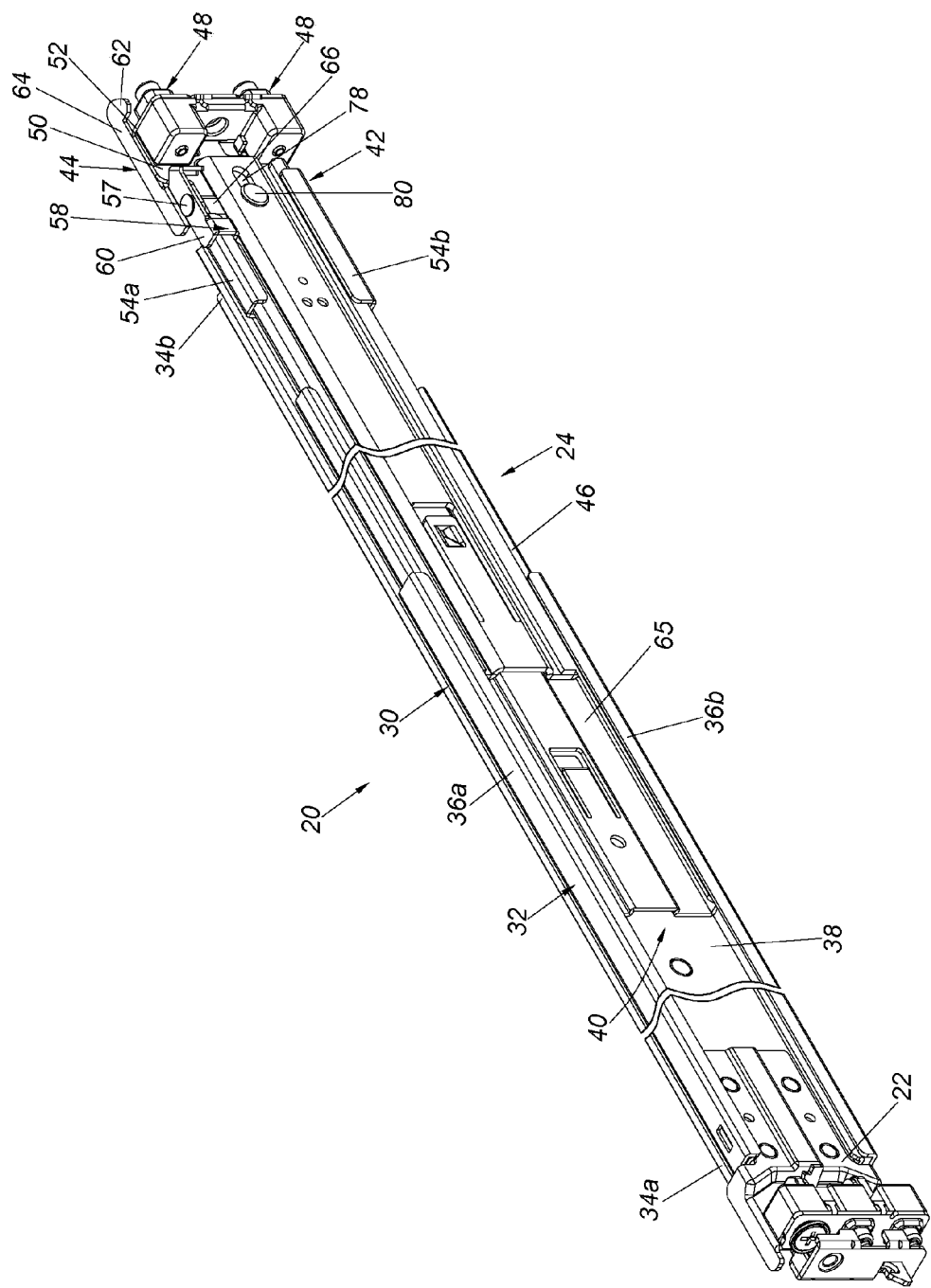
FIG. 2 is a diagram showing the slide rail assembly according to an embodiment of the present invention.
Figure 3:
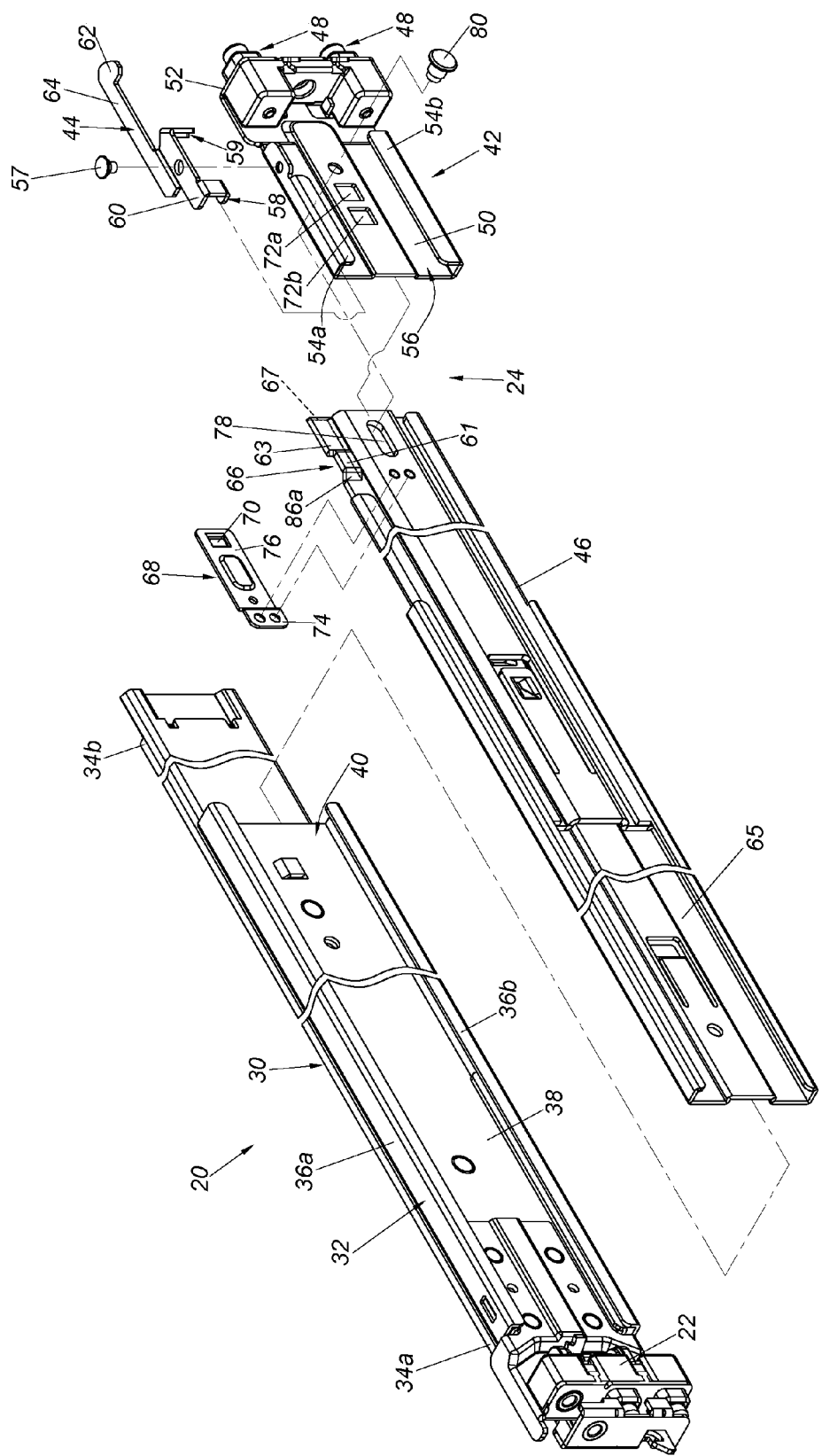
FIG. 3 is an exploded view of the slide rail assembly according to an embodiment of the present invention.

As shown in FIG. 2 and FIG. 3, the slide rail assembly 20 comprises a rail member 30 and a supporting rail 32. The rail member 30 has a first end part 34a and a second end part 34b opposite to the first end part 34a. The supporting rail 32 is fixedly connected to a back board of the rail member 30, such that the supporting rail 32 can be seen as a portion of the rail member 30. The supporting rail 32 has an upper wall 36a, a lower wall 36b, and a longitudinal wall 38 connected between the upper wall 36a and the lower wall 36b. A passage 40 is defined by the upper wall 36a, the lower wall 36b and the longitudinal wall 38. The first bracket 22 is connected to the rail member 30 and adjacent to the first end part 34a. On the other hand, the bracket device 24 is located adjacent to the second end part 34b of the rail member 30. Wherein, the bracket device 24 comprises a second bracket 42, a fastening member 44 and a supporting frame 46.

The second bracket 42 comprises at least one mounting member 48, such as comprising two mounting members 48. In the present embodiment, the second bracket 42 further comprises a side wall 50 and an end wall 52. In particular, the end wall 52 is substantially perpendicularly connected to the side wall 50. Preferably, the mounting members 48 are mounted adjacent to an end of the side wall 50, such as being mounted on the end wall 52. Preferably, the side wall 50 of the second bracket 42 further has a first bending part 54a and a second bending part 54b. A space 56 is defined between the first bending part 54a and the second bending part 54b.

The fastening member 44 is movably mounted to the second bracket 42. Preferably, the fastening member 44 is pivoted to the second bracket 42 through a shaft 57. For example, the fastening member 44 is pivoted to the first bending part 54a of the second bracket 42. The fastening member 44 comprises a supporting leg 58 and a guiding leg 59. Preferably, the fastening member 44 further comprises a mounting part 60, a fastening part 62 and an arm part 64 located between the mounting part 60 and the fastening part 62. In the present embodiment, the supporting leg 58 is bent relative to the mounting part 60 and adjacent to the space 56 of the second bracket 42. Preferably, the guiding leg 59 and the supporting leg 58 are spaced from each other. The guiding leg 59 is bent relative to the mounting part 60 and adjacent to the space 56 of the second bracket 42.

The supporting frame 46 is movably mounted to the supporting rail 32, and is movable relative to the passage 40 of the supporting rail 32. In the present embodiment, the supporting frame 46 is movably mounted to the supporting rail 32 through an auxiliary member 65. However, the supporting frame 46 can also be directly movably mounted to the passage 40 of the supporting rail 32, but the present invention is not limited thereto. Furthermore, the supporting frame 46 is movably mounted between the rail member 30 and the second bracket 42. The supporting frame 46 is movable relative to the second bracket 42. For example, the supporting frame 46 is movable in the space 56. The supporting frame 46 comprises a supporting structure 66 and an extension part 63 adjacent to the supporting structure 66. The extension part 63 is longitudinally arranged. In the present embodiment, the supporting structure 66 is integrally formed on the supporting frame 46. However, in other embodiments, the supporting structure 66 can be an additional component fixedly attached to the supporting frame 46. In the present embodiment, the supporting structure 66 is protruded relative to the extension part 63. The supporting structure 66 and the extension part 63 are located at different heights. The supporting structure 66 comprises a supporting section 61.

Preferably, the supporting frame 46 further comprises a guiding structure 67. Wherein, the extension part 63 is located between the supporting structure 66 and the guiding structure 67.

The slide rail assembly 20 further comprises an elastic member 68 attached to the supporting frame 46. The elastic member 68 has an engaging feature 70. The second bracket 42 comprises a first feature 72a and a second feature 72b located at different positions. The engaging feature 70 is configured to engage with one of the first feature 72a and the second feature 72b. In particular, the elastic member 68 comprises a connecting part 74 and an elastic part 76 connected to the connecting part 74 and tilted relative to the connecting part 74. The connecting part 74 can be connected to the supporting frame 46 by riveting, screwing, or engaging. In the present embodiment, the engaging feature 70 is a protrusion, and the first feature 72a and the second feature 72b are positioning holes for accommodating the protrusion.

Preferably, one of the supporting frame 46 and the second bracket 42 comprises a limiting structure 78. The supporting frame 46 is movable relative to the second bracket 42 within a limited range defined by the limiting structure 78. In the present embodiment, the limiting structure 78 can be a bounded elongated hole, and the slide rail assembly 20 (or the bracket device 24) further comprises a connecting member 80 passing through a portion of the limiting structure 78 for connecting the supporting frame 46 to the second bracket 42.

Figure 4:
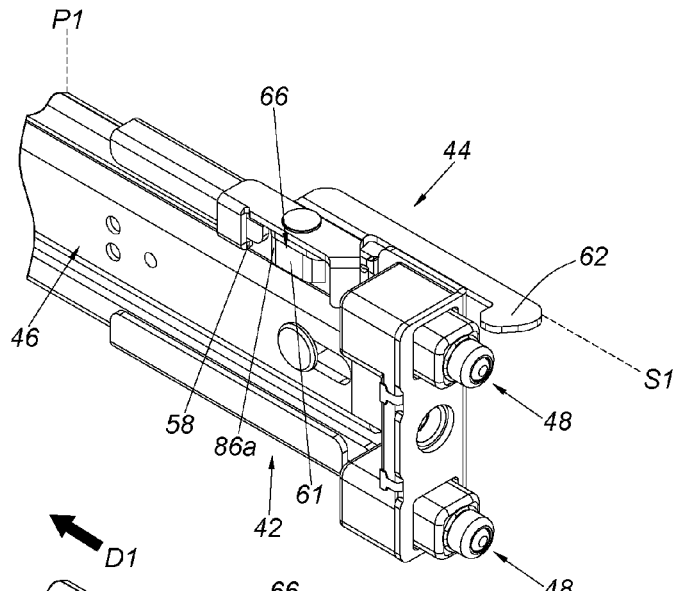
FIG. 4 is a diagram showing a bracket device according to an embodiment of the present invention, wherein a fastening member is in a first state.

As shown in FIG. 4, one of the supporting leg 58 of the fastening member 44 and the supporting structure 66 of the supporting frame 46 comprises at least one guiding section. The at least one guiding section has an inclined surface or a curved surface. In the present embodiment, the supporting structure 66 has a first guiding section 86a, and the first guiding section 86a is adjacent to the supporting section 61. When the supporting frame 46 is located at a first position P1 relative to the second bracket 42, a predetermined distance is defined between the supporting structure 66 of the supporting frame 46 and the supporting leg 58 of the fastening member 44. As such, the supporting structure 66 of the supporting frame 46 does not abut against the supporting leg 58 of the fastening member 44, so as to allow the fastening member 44 to be in a first state S1 (such as a locking state) relative to the at least one mounting member 48. Specifically, in the first state S1, the fastening part 62 of the fastening member 44 is close to the at least one mounting member 48.

Figure 5:
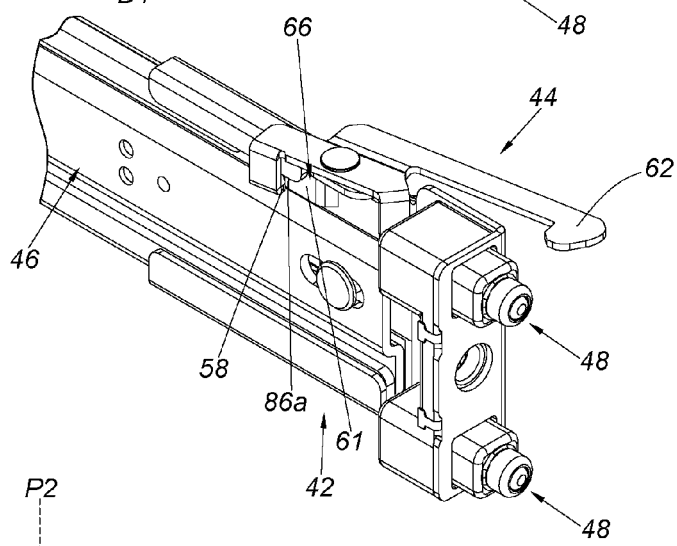
FIG. 5 is a diagram showing the bracket device according to an embodiment of the present invention, wherein the fastening member is no longer in the first state.
Figure 6:
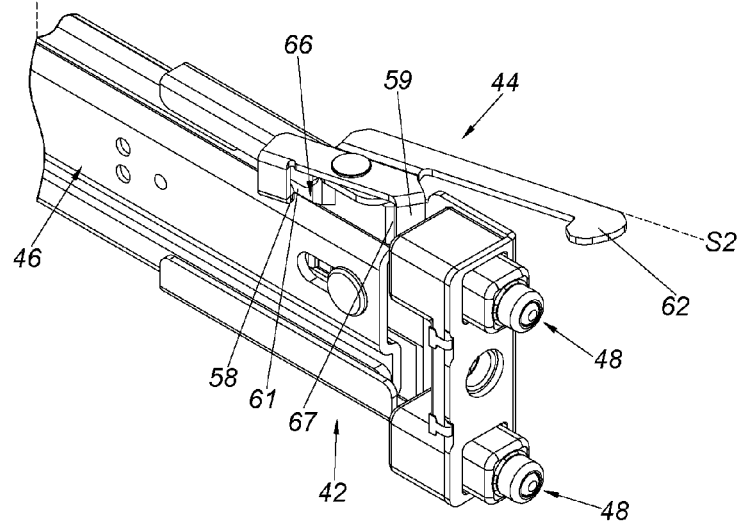
FIG. 6 is a diagram showing the bracket device according to an embodiment of the present invention, wherein the fastening member is in a second state.

As shown in FIG. 5 and FIG. 6, when the supporting frame 46 is moved away from the first position P1 relative to the second bracket 42, the supporting structure 66 of the supporting frame 46 is configured to abut against or support the supporting leg 58 of the fastening member 44, so as to allow the fastening member 44 to be no longer in the first state S1 relative to the at least one mounting member 48.

In particular, when the supporting frame 46 is moved relative to the second bracket 42 along a first direction D1 from the first position P1 to a second position P2, the supporting structure 66 of the supporting frame 46 contacts the supporting leg 58 through the first guiding section 86a for rotating the fastening member 44. When the supporting frame 46 reaches the second position P2, the supporting section 61 of the supporting structure 66 of the supporting frame 46 abuts against the supporting leg 58 of the fastening member 44, so as to drive the fastening member 44 to switch from the first state S1 to a second state S2 (such as an unlocking state) relative to the at least one mounting member 48. When the supporting structure 66 of the supporting frame 46 abuts against the supporting leg 58, the fastening member 44 can be held in the second state S2. On the other hand, when the supporting frame 46 is located at the second position P2 relative to the second bracket 42, the guiding structure 67 of the supporting frame 46 is located at a position corresponding to the guiding leg 59 of the fastening member 44. Specifically, one of the guiding structure 67 of the supporting frame 46 and the guiding leg 59 of the fastening member 44 has an inclined surface or a curved surface. In addition, when the supporting frame 46 is moved relative to the second bracket 42 away from the first position P1 to the second position P2, the fastening member 44 is in the second state S2. Wherein, when the fastening member 44 is in the second state S2, the fastening part 62 of the fastening member 44 is away from the at least one mounting member 48.

Figure 7:
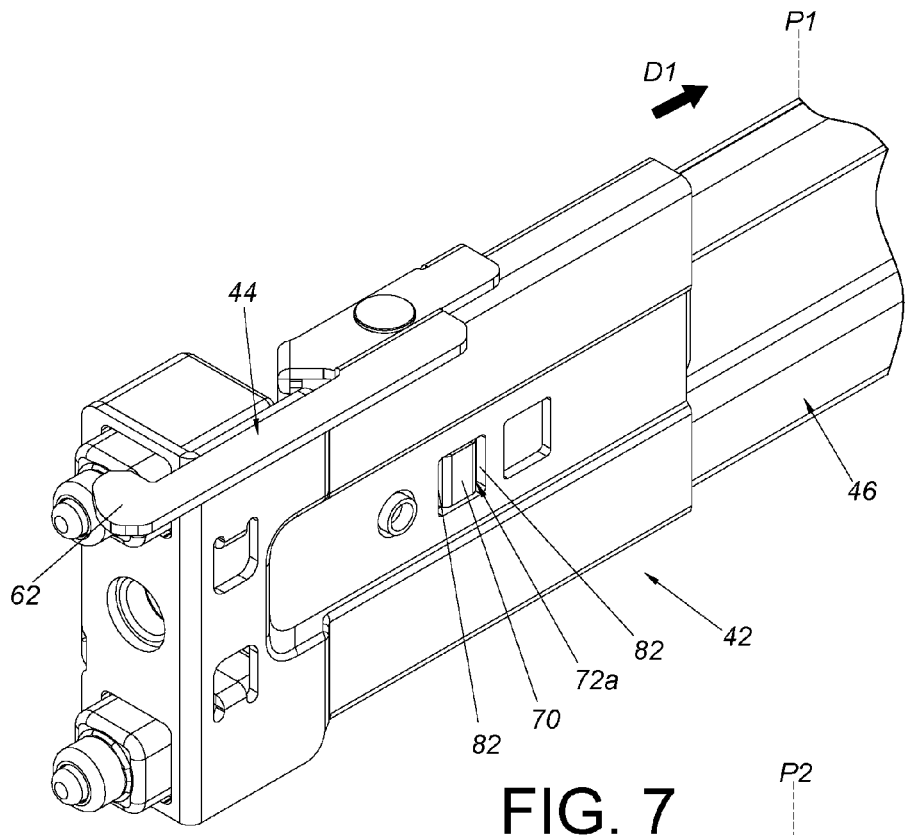
FIG. 7 is a diagram showing a supporting frame of the bracket device located at a first position relative to a second bracket according to an embodiment of the present invention.

As shown in FIG. 7, when the supporting frame 46 is located at the first position P1 relative to the second bracket 42, the engaging feature 70 of the elastic member 68 is engaged with the first feature 72*a* of the second bracket 42, and the engaging feature 70 corresponds to at least one blocking wall 82 of the first feature 72*a*. Accordingly, the supporting frame 46 can be held at the first position P1 relative to the second bracket 42.

Figure 8:
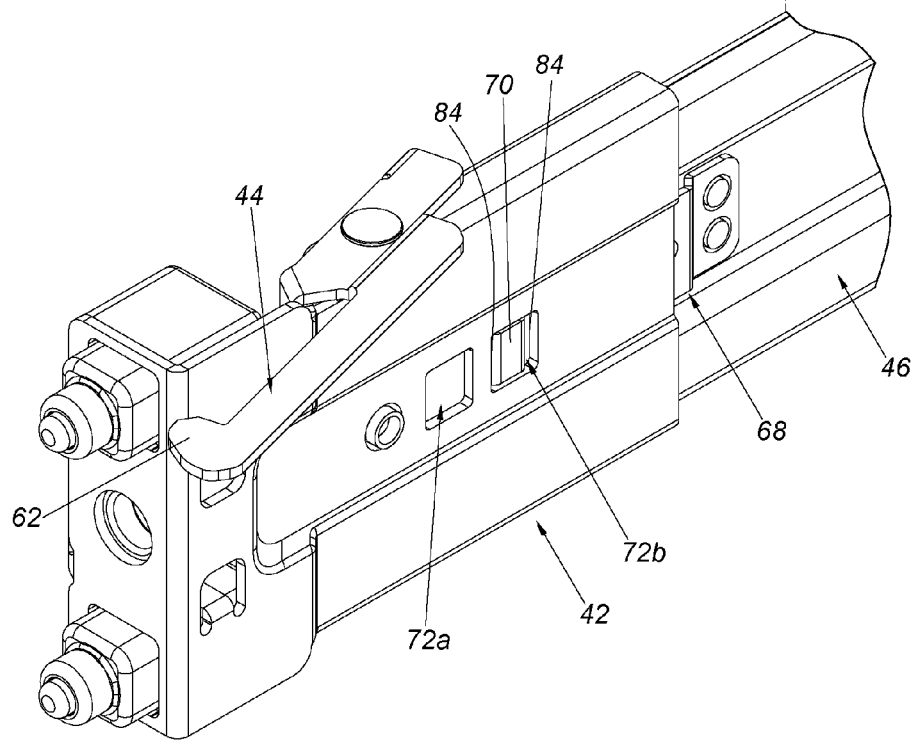
FIG. 8 is a diagram showing the supporting frame of the bracket device located at a second position relative to the second bracket according to an embodiment of the present invention.

As shown in FIG. 8, the engaging feature 70 of the elastic member 68 can be directly operated to disengage from the first feature 72*a* of the second bracket 42, such that the supporting frame 46 can be further moved relative to the second bracket 42 along the first direction D1 from the first position P1 to the second position P2. On the other hand, the engaging feature 70 has a guiding mechanism, such as an inclined surface or a curved surface, corresponding to ends of the first feature 72*a* and the second feature 72*b*. As such, the engaging feature 70 can be selectively engaged with one of the first feature 72*a* and the second feature 72*b* by moving the supporting frame 46 relative to the second bracket 42. When the engaging feature 70 of the elastic member 68 is engaged with the second feature 72*b* of the second bracket 42, the engaging feature 70 corresponds to at least one blocking wall 84 of the second feature 72*b*. Accordingly, the supporting frame 46 can be held at the second position P2 relative to the second bracket 42.

Figure 9:
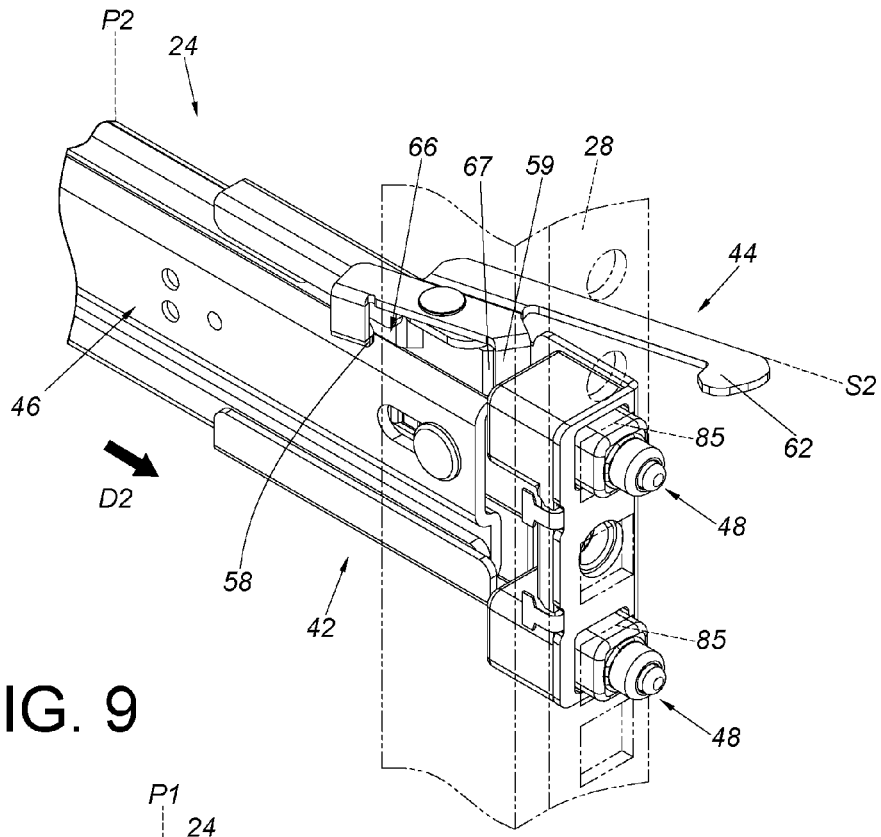
FIG. 9 is a diagram showing at least one mounting member of the bracket device entering a hole of the second post, and the fastening member being in the second state according to an embodiment of the present invention.

As shown in FIG. 9, when the supporting frame 46 is located at the second position P2 relative to the second bracket 42, the supporting structure 66 of the supporting frame 46 abuts against the supporting leg 58 of the fastening member 44, so as to allow the fastening member 44 to be in the second state S2 relative to the second post 28. Wherein, the fastening part 62 of the fastening member 44 is away from the at least one mounting member 48, and the fastening part 62 does not lock the second post 28. Furthermore, when the bracket device 24 is going to be mounted to the second post 28, a user can move the bracket device 24 along a second direction D2 (such as a direction opposite to the first direction D1), so as to allow the at least one mounting member 48 of the second bracket 42 to enter a corresponding hole 85 of the second post 28, and the second bracket 42 then abuts against the second post 28 accordingly.

Figure 10:
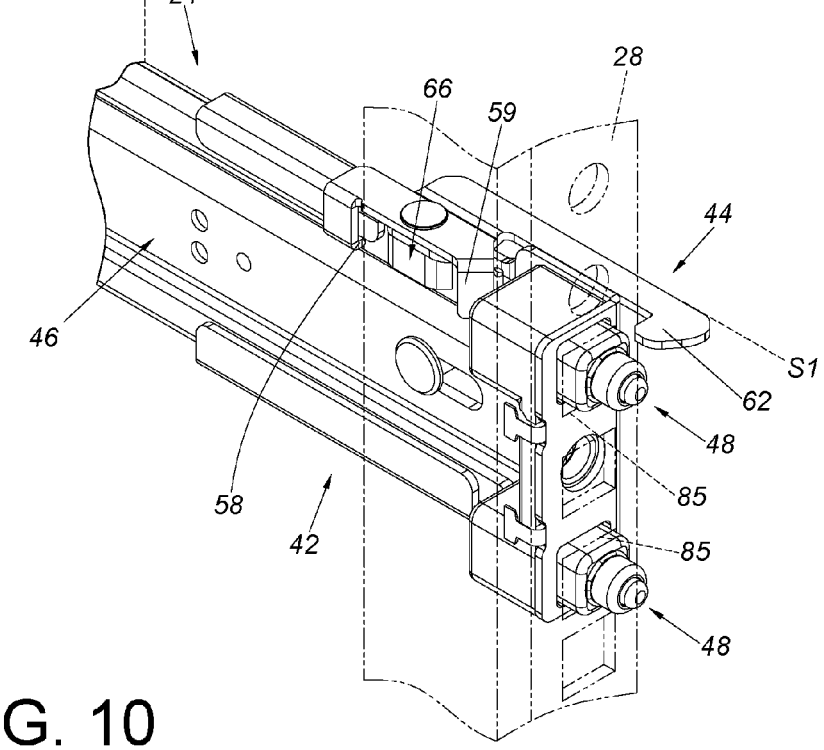
FIG. 10 is a diagram showing the at least one mounting member of the bracket device entering a hole of the second post, and the fastening member being in the first state according to an embodiment of the present invention.

As shown in FIG. 10, when the second bracket 42 abuts against the second post 28, the user can further apply a force along the second direction D2, so as to move the supporting frame 46 relative to the second bracket 42 along the second direction D2 from the second position P2 to the first position P1. As such, the supporting structure 66 of the supporting frame 46 no longer abuts against the supporting leg 58 of the fastening member 44, so as to allow the fastening member 44 to operatively return to the first state S1. Preferably, when the supporting frame 46 is moved relative to the second bracket 42 from the second position P2 along the second direction D2, the guiding structure 67 is configured to drive the guiding leg 59 of the fastening member 44, so as to allow the fastening member 44 to return to the first state S1 from the second state S2. Accordingly, the fastening part 62 of the fastening member 44 is close to the at least one mounting member 48, such that the fastening member 44 locks the second post 28. As such operation of mounting the bracket device 24 to the second post 28 is completed.

As shown in FIG. 11, the fastening member 44 is in the second state S2 relative to the at least one mounting member 48, and the fastening part 62 of the fastening member 44 is away from the at least one mounting member 48. Wherein, the supporting section 61 of the supporting structure 66 of the supporting frame 46 is configured to abut against or support the supporting leg 58 of the fastening member (please also refer to FIG. 12). On the other hand, when the supporting frame 46 is located at the second position P2 relative to the second bracket 42, the guiding structure 67 of the supporting frame 46 is located at a position corresponding to or adjacent to the guiding leg 59 of the fastening member 44. When the slide rail assembly 20 is going to be mounted to the first post 26 and the second post 28, the user can move the slide rail assembly 20 along the second direction D2 first, so as to allow the at least one mounting member 48 of the second bracket 42 of the bracket device 24 to move toward the corresponding hole 85 of the second post 28.

As shown in FIG. 13, after the at least one mounting member 48 of the second bracket 42 of the bracket device 24 enters the corresponding hole 85 of the second post 28, the second bracket 42 (such as the end wall 52) is configured to abut against the second post 28. Furthermore, the user can apply a force along the second direction D2 to move the supporting frame 46 relative to the second bracket 42 along the second direction D2 from the second position P2 to the first position P1. In other words, the supporting section 61 of the supporting structure 66 of the supporting frame 46 does not abut against the supporting leg 58 of the fastening member 44 (please also refer to FIG. 14), so as to allow the fastening member 44 to operatively return to the first state S1. On the other hand, when the supporting frame 46 is moved relative to the second bracket 42 from the second position P2 along the second direction D2, the guiding structure 67 is configured to drive the guiding leg 59 of the fastening member 44, so as to rotate the fastening member 44 to return to the first state S1 from the second state S2. Wherein, the fastening part 62 of the fastening member 44 is close to the at least one mounting member 48, and the fastening member 44 is configured to lock the second post 28. Preferably, when the fastening member 44 is in the first state S1, the extension part 63 of the supporting frame 46 abuts against the guiding leg 59, such that the fastening member 44 is held in the first state S1. More particularly, as shown in FIG. 12 and FIG. 14, the supporting leg 58 of the fastening member 44 has a second guiding section 86*b*. Wherein, during a process of moving the supporting frame 46 relative to the second bracket 42 along the first direction D1 (such as a direction opposite to the second direction D2) from the first position P1 to the second position P2, the fastening member 44 can be easily driven to switch from the first state S1 to the second state S2 by the supporting frame 46 through the first guiding section 86*a* or the second guiding section 86*b*.

Figure 15:
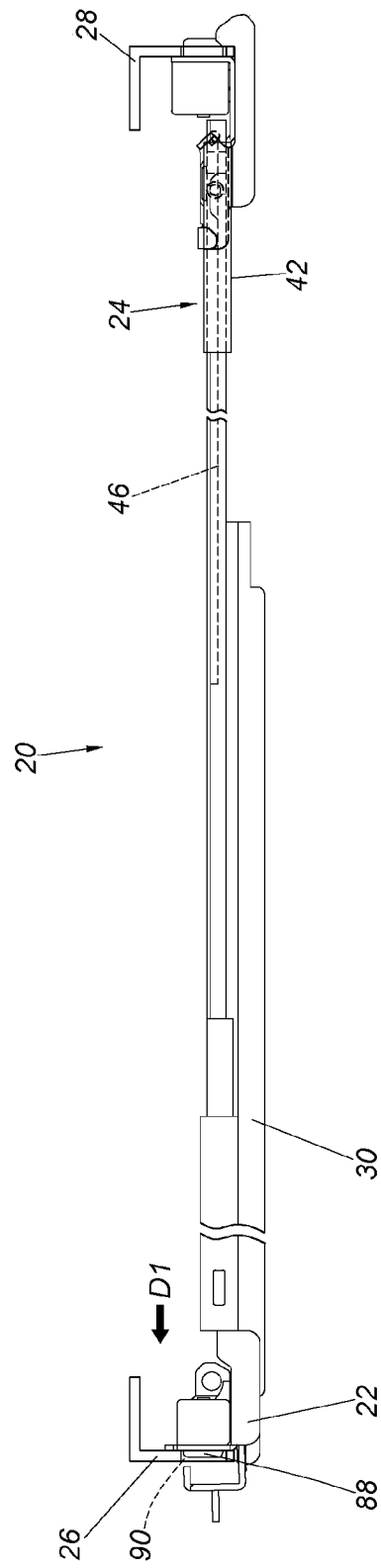
FIG. 15 is a diagram showing a first bracket of the slide rail assembly being mounted to the first post according to an embodiment of the present invention.

As shown in FIG. 15, after the operation of mounting the bracket device 24 to the second post 28 is completed, the user can further operate the rail member 30 to move relative to the supporting frame 46 along the first direction D1, so as to allow at least one mounting member 88 of the first bracket 22 to enter a corresponding hole 90 of the first post 26. Such operation is well known to those skilled in the art. For simplification, no further illustration is provided. Therefore, the slide rail assembly 20 can be mounted to the first post 26 and the second post 28. Furthermore, the first bracket 22 and the second bracket 42 of the bracket device 24 can be respectively detached from the first post 26 and the second post 28 (please refer to FIG. 15, FIG. 13, and FIG. 11, for simplification, no further illustration is provided).

Figure 16:
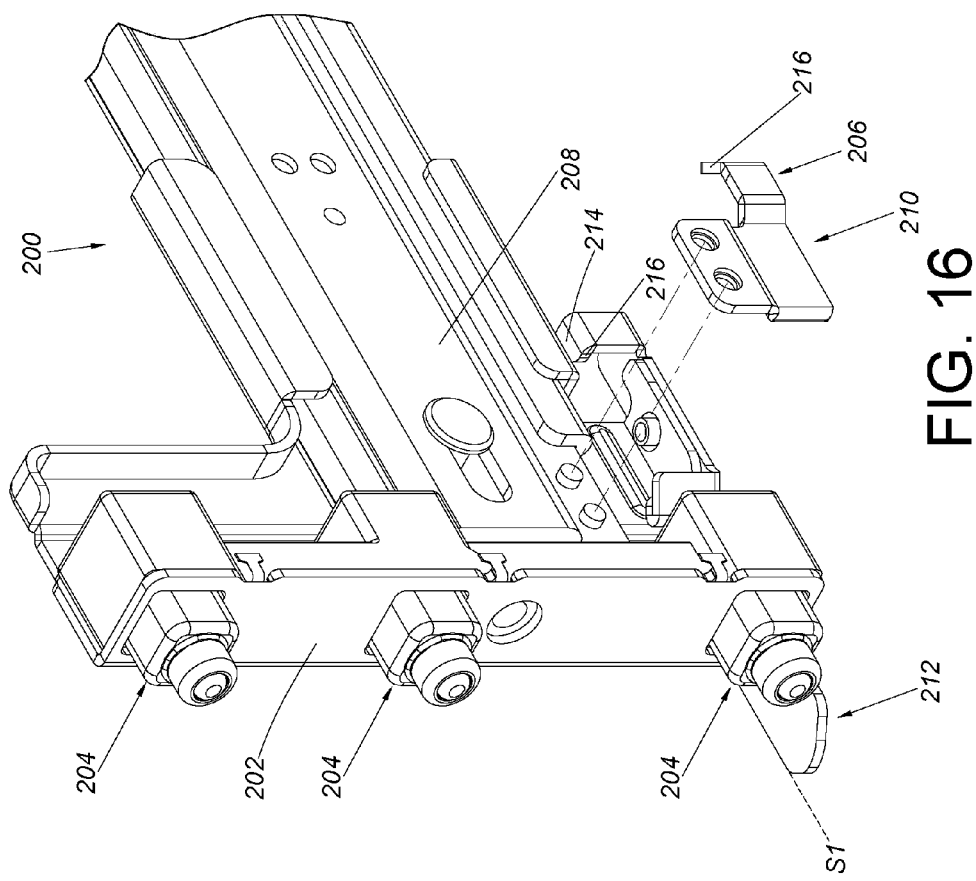
FIG. 16 is a diagram showing a component, comprising a supporting structure, of the bracket device according to another embodiment of the present invention.
Figure 17:
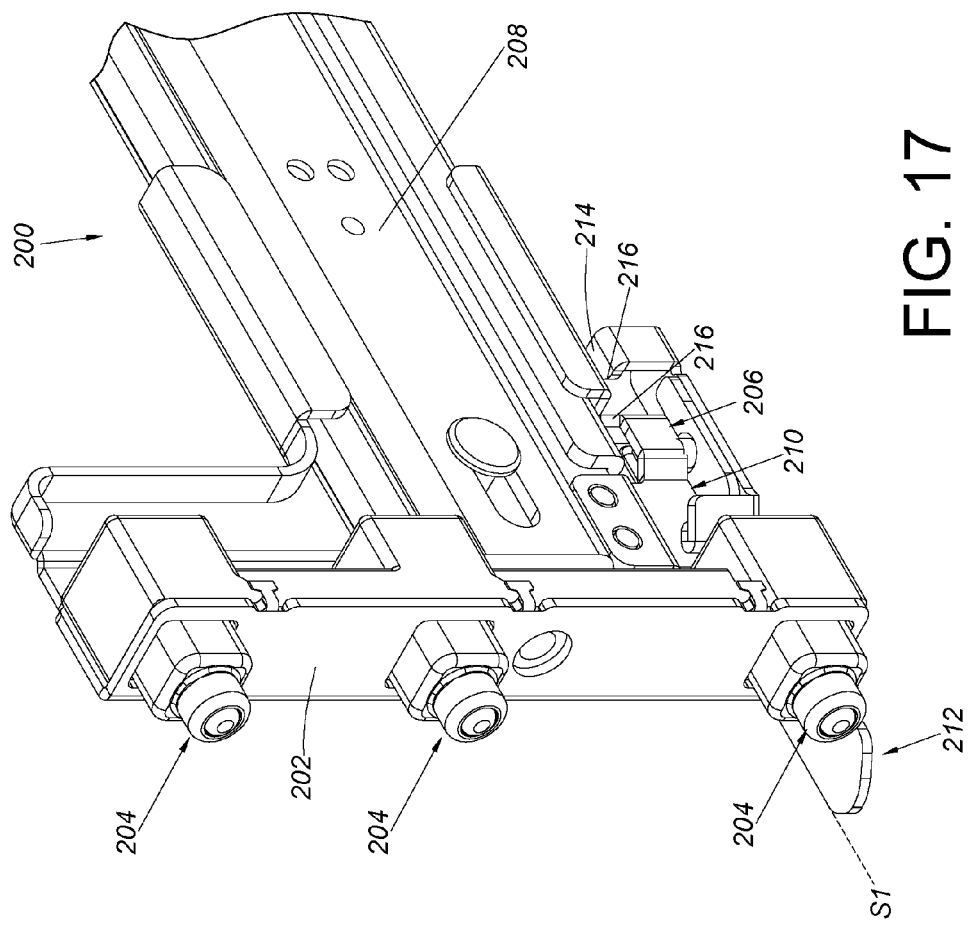
FIG. 17 is a diagram showing a bracket device according to another embodiment of the present invention.

FIG. 16 and FIG. 17 are diagrams showing a bracket device 200 according to another embodiment of the present invention. Different from the bracket device 24 of the aforementioned embodiment, the bracket device 200 comprises a larger end wall 202 and more mounting members 204 (such as comprising three mounting members 204) arranged on the end wall 202. Moreover, the supporting structure 206 is not integrally formed on the supporting frame 208. In particular, an additional component 210 can be connected to the supporting frame 208 by riveting, screwing or welding, and the component 210 comprises the supporting structure 206. Similarly, one of the supporting leg 214 of the fastening member 212 and the supporting structure 206 of the supporting frame 208 comprises at least one guiding section 216 having an inclined surface or a curved surface, for assisting the supporting frame 208 in driving the fastening member 212 to switch from a first state S1 to a second state.

Through the aforementioned arrangement, the slide rail assembly can be conveniently and quickly mounted to or detached from the rack only by one user in front of the rack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device, comprising:
   a bracket comprising at least one mounting member;
   a fastening member movably mounted to the bracket, the fastening member comprising a supporting leg; and
   a supporting frame movable relative to the bracket, the supporting frame comprising a supporting structure;
   wherein when the supporting frame is located at a position relative to the bracket, the supporting structure of the supporting frame does not abut against the supporting leg of the fastening member, so as to allow the fastening member to be in a first state relative to the at least one mounting member;
   wherein when the supporting frame is moved away from the position relative to the bracket, the supporting structure of the supporting frame is configured to abut against the supporting leg of the fastening member, so as to allow the fastening member to be in a second state relative to the at least one mounting member;
   wherein the supporting frame further comprises an extension part and a guiding structure, the extension part is located between the supporting structure and the guiding structure, the supporting structure comprises a supporting section and a guiding section adjacent to the supporting section, the fastening member further comprises a guiding leg; when the supporting frame is located at the position relative to the bracket, the extension part of the supporting frame abuts against the guiding leg of the fastening member so as to hold the fastening member in the first state; when the supporting frame is moved away from the position relative to the bracket, the guiding section of the supporting structure is configured to move the supporting leg of the fastening member so as to drive the fastening member to switch from the first state to the second state; when the fastening member is in the second state, the supporting section of the supporting structure is configured to abut against the supporting leg of the fastening member; when the supporting frame returns to the position relative to the bracket, the guiding structure of the supporting frame is configured to drive the fastening member to switch from the second state to the first state through the guiding leg.

2. The bracket device of claim 1, further comprising an elastic member attached to the supporting frame, wherein the elastic member has an engaging feature, the bracket further comprises a first feature and a second feature located at different positions, and the engaging feature is configured to engage with one of the first feature and the second feature.

3. The bracket device of claim 2, wherein the engaging feature is a protrusion, and the first feature and the second feature are positioning holes.

4. The bracket device of claim 2, wherein when the supporting frame is located at the position relative to the bracket, the engaging feature of the elastic member is engaged with the first feature of the bracket.

5. The bracket device of claim 1, wherein one of the supporting frame and the bracket comprises a limiting structure, the supporting frame is movable relative to the bracket within a limited range defined by the limiting structure.

6. The bracket device of claim 1, wherein the bracket comprises a side wall and an end wall substantially particularly connected to the side wall, and the at least one mounting member is mounted to the end wall.

7. The bracket device of claim 6, wherein the side wall of the bracket has a first bending part and a second bending part, a space is defined between the first bending part and the second bending part, and the supporting frame is movable in the space.

8. The bracket device of claim 1, wherein the fastening member is pivoted to the bracket.

9. A bracket device, comprising:
   a bracket comprising a side wall, and at least one mounting member mounted adjacent to an end of the side wall;
   a fastening member movably mounted to the bracket, the fastening member comprising a supporting leg; and
   a supporting frame movably mounted to the bracket, the supporting frame comprising a supporting structure;
   wherein when the supporting frame is located at a position relative to the bracket, the fastening member is in a locking state relative to the at least one mounting member;
   wherein when the supporting frame is moved away from the position relative to the bracket, the supporting structure of the supporting frame is configured to drive the fastening member to be no longer in the locking state relative to the at least one mounting member through the supporting leg;
   wherein the fastening member is pivoted to the bracket, the supporting frame further comprises an extension part and a guiding structure, the extension part is located between the supporting structure and the guiding structure, the supporting structure comprises a supporting section and a guiding section adjacent to the supporting section, the fastening member further comprises a guiding leg; when the supporting frame is located at the position relative to the bracket, the extension part of the supporting frame abuts against the guiding leg of the fastening member so as to hold the fastening member in the locking state; when the supporting frame is moved away from the position relative to the bracket, the guiding section of the supporting structure is configured to move the supporting leg of the fastening member so as to drive the fastening member to be no longer in the locking state; when the fastening member is not in the locking state, the supporting section of the supporting structure is configured to abut against the supporting leg of the fastening member; when the supporting frame returns to the position relative to the bracket, the guiding structure of the supporting frame is configured to drive the fastening member to return to the locking state through the guiding leg.

10. The bracket device of claim 9, further comprising an elastic member attached to the supporting frame, wherein the elastic member has an engaging feature, the bracket further comprises a first feature and a second feature located at different positions, and the engaging feature is engaged with one of the first feature and the second feature.

11. The bracket device of claim 10, wherein the engaging feature is a protrusion, and the first feature and the second feature are positioning holes.

12. The bracket device of claim 10, wherein when the supporting frame is located at the position relative to the bracket, the engaging feature of the elastic member is engaged with the first feature of the bracket; when the supporting frame is moved away from the bracket, the engaging feature of the elastic member is engaged with the second feature of the bracket.

13. The bracket device of claim 9, wherein one of the supporting frame and the bracket comprises a limiting structure, the supporting frame is movable relative to the bracket within a limited range defined by the limiting structure.

14. The bracket device of claim 13, wherein the limiting structure is a bounded elongated hole, and the bracket device further comprises a connecting member passing through a portion of the limiting structure for connecting the supporting frame to the bracket.

15. The bracket device of claim 9, wherein the side wall of the bracket has a first bending part and a second bending part, a space is defined between the first bending part and the second bending part, and the supporting frame is movable in the space.

16. A bracket device, configured to be mounted to a post, the post having at least one hole, the bracket device comprising:
a bracket comprising at least one mounting member;
a fastening member movably mounted to the bracket; and
a supporting frame movable relative to the bracket to be located at one of a first position and a second position;
wherein when the supporting frame is located at the second position relative to the bracket, the supporting frame is configured to hold the fastening member to be in an unlocking state relative to the at least one mounting member of the bracket;
wherein when the at least one mounting member of the bracket enters the at least one hole of the post along a direction with the bracket abutting against the post to allow the supporting frame to move relative to the bracket along the direction from the second position to the first position, the supporting frame drives the fastening member to switch from the unlocking state to a locking state for locking the post;
wherein the supporting frame further comprises an extension part and a guiding structure, the extension part is located between the supporting structure and the guiding structure, the supporting structure comprises a supporting section and a guiding section adjacent to the supporting section, the fastening member further comprises a guiding leg; when the supporting frame is located at the position relative to the bracket, the extension part of the supporting frame abuts against the guiding leg of the fastening member so as to hold the fastening member in the first state; when the supporting frame is moved away from the position relative to the bracket, the guiding section of the supporting structure is configured to move the supporting leg of the fastening member so as to drive the fastening member to switch from the first state to the second state; when the fastening member is in the second state, the supporting section of the supporting structure is configured to abut against the supporting leg of the fastening member; when the supporting frame returns to the position relative to the bracket, the guiding structure of the supporting frame is configured to drive the fastening member to switch from the second state to the first state through the guiding leg.

17. The bracket device of claim 16, wherein the supporting frame comprises a supporting structure and a guiding structure, the fastening member is pivoted to the bracket, the fastening member comprises a supporting leg and a guiding leg; when the supporting frame is located at the second position relative to the bracket, the supporting structure of the supporting frame is configured to support the supporting leg of the fastening member; when the supporting frame is moved relative to the bracket along the direction from the second position to the first position, the guiding structure of the supporting frame drives the fastening member to switch from the unlocking state to the locking state through the guiding leg.

18. The bracket device of claim 16, further comprising an elastic member attached to the supporting frame, wherein the elastic member has an engaging feature, the bracket further comprises a first feature and a second feature located at different positions, the engaging feature is configured to engage with one of the first feature and the second feature, and when the supporting frame is located at the first position relative to the bracket, the engaging feature of the elastic member is engaged with the second feature of the bracket.

* * * * *